United States Patent [19]

Meyer et al.

[11] Patent Number: 4,962,461
[45] Date of Patent: Oct. 9, 1990

[54] METHOD FOR THE REPRODUCABLE FORMATION OF MATERIAL LAYERS AND/OR THE TREATMENT OF SEMICONDUCTOR MATERIALS LAYERS

[75] Inventors: Meinhard Meyer, Munich; Oswald Störmer, Tuntenhausen, both of Fed. Rep. of Germany

[73] Assignee: Messerschmitt-Bölkow-Blohm GmbH, Munich, Fed. Rep. of Germany

[21] Appl. No.: 462,358

[22] Filed: Jan. 2, 1990

Related U.S. Application Data

[63] Continuation of Ser. No. 170,548, Mar. 21, 1988, abandoned.

[30] Foreign Application Priority Data

Mar. 28, 1987 [DE] Fed. Rep. of Germany ....... 3710365

[51] Int. Cl.$^5$ .................... G01N 27/02; C23C 14/54
[52] U.S. Cl. .................... 364/482; 364/488; 364/496; 324/71.5; 324/600; 427/10; 437/8; 437/170
[58] Field of Search .................... 364/488–491, 364/482, 496, 499, 500, 572, 576, 579, 726; 324/57 R, 57 PS, 58.5 A, 71.5, 118; 437/8, 170, 171, 172; 427/9, 10

[56] References Cited

U.S. PATENT DOCUMENTS 3,628,137 12/1971 Mazur .................... 364/482
4,331,702 5/1982 Hieber et al. .................... 437/187
4,588,942 5/1986 Kitahara .................... 324/71.5

OTHER PUBLICATIONS

"Automatic Spectroscopy of Solids in the Low-Frequency Range", by U. Staudt et al., Solid State Ionic 2, No. 3, Jun. 1981, pp. 175–183.

"Measuring Contact Contamination Automatically", by Asar et al., The Western Electric Engineer, vol. 23, No. 3, Jul. 1979, pp. 32–38.

Primary Examiner—Parshotam S. Lall
Assistant Examiner—V. N. Trans
Attorney, Agent, or Firm—Kenyon & Kenyon

[57] ABSTRACT

A method and apparatus for process control in both the production of uniform material layers using vapor deposition, sputtering, chemical deposition, etc. and the treating of material layers. In particular, the process and apparatus are particularly useful in semiconductor fabrication where ion implantation or diffusion is used. A brief test signal of preset shape, frequency spectrum, or frequency sequence is applied at given time intervals to the material layer whose production characteristics need to be monitored. The measuring signal is applied to a digital evaluation circuit in a process control computer. The signal has various components whose time constants and/or conductivities are different from one another and which together are characteristics of the current flowing through the layer being monitored. In particular, the current flowing over the surface layer $i_1$, the current flowing through particle houndary areas $i_3$, and the current through homogeneous material ranges $i_2$ can be distinguished from one another. The results from the measuring signal can be compared to stored reference values for the layer. Discrepancies between the actual and desired values are measured and used to adjust the process in a known fashion.

49 Claims, 6 Drawing Sheets

METHOD FOR THE REPRODUCABLE FORMATION OF MATERIAL LAYERS AND/OR THE TREATMENT OF SEMICONDUCTOR MATERIALS LAYERS

This application is a continuation-in-part, continuation, of application Ser. No. 170,548, filed Mar. 21, 1988, now abandoned.

BACKGROUND AND FIELD OF THE INVENTION

This invention relates to a method for the reproduceable formation of material layers by vapor deposition, sputtering, chemical deposition, etc. In particular, the formation of semiconductor layers through diffusion or ion implantation with at least one parameter of the material layer being measured during the formation of the layer and used as a measuring signal in a digital evaluation circuit for on-line control of the layer formation process is disclosed.

Electrical, i.e. time or frequency-dependent measuring methods where a defined change in one value in the electrical system being studied (for example, current) is measured, and the measurement of this value, including evaluation of the measuring signal (for example, voltage) as a function of time or frequency, are used in the study of complex reactions and conducting processes in electrochemistry (Techniques of Electrochemistry, E. Yeager, A. J. Salking, Wiley-Interscience, N.Y. 1972).

Furthermore, when used with solid-state cells, these methods can separate the electrode reactions from the conduction processes in the interior of the solid-state material (M. Meyer et al., Solid State Ionics 9, 10 (1983), pages 689 to 694).

Electrical conduction in solid-state material is determined by intrinsic properties such as current flow through the material areas, the degree of doping in the material, and the temperature of the materials and extrinsic properties such as the structure (texture), morphology, and production conditions of the particular material.

In the field of thin-film technology, slight deviations in the processing conditions used in a particular production method will produce thin layers with significant structure and morphology changes, which cause large property changes in the conductivity, capacitance, inductivity, adhesion capability, hardness, density, and resistance to wear and tear, to oxidation and to corrosion.

EP A2 00 33 507 shows the use of direct current measurements for determining the layer thickness and/or the structure changes of the electrically conducting layers formed during on-line-type production methods. For determining the temperature a resistance thermometer is used. This method is suitable only for conductivity determination of electrical conductors due to the use of direct current.

SUMMARY OF THE INVENTION

The purpose of this invention is to create a method which provides information regarding the structure (texture), the morphology and the layer thickness of the material layer formations during the treatment of discrete material layers and, in particular, of the discrete semiconductor layers, forming this information into characteristic values for use as measuring signals and evaluating these characteristic values for the purpose of on-line control or regulation of the process.

According to the invention, at given time intervals a test signal with preset shape, frequency spectrum, or preset frequency sequence is applied briefly to the material layer. A process control computer, using a digital evaluation circuit, directs the application of a particular test signal (current signal) and evaluates the resulting measuring signal (voltage signal). Impedance components which are separable from each other in time are determined which different values or value ranges of time constants and, possibly, furthermore additional different values of conductivities. These impedance components together are characteristic of the current (intrinsic current) flowing through the homogeneous material regions (particle), the current flowing over the particle boundary areas (grain boundary current) and the current flowing over the layer material (surface current).

Layers of identical matter and identical thickness with, however, either different structure, texture, or morphology, differ strongly in their electrical impedance. The total impedance of a layer is the sum of the intrinsic, grain boundary and surface impedance, with the intrinsic impedance including the flow of current through the interior of the particle (intrinsic conductivity), the grain boundary impedance including the current flow over the particle edge areas under the influence of the boundary area enrichments, and the surface impedance including the current flow over the surfaces of the particle composite (layer). By applying time varying electrical measuring methods, those fractions of the total impedance with different time constants or conductivity can be separated in time. Examples of the measuring methods include galvanostatic turn-on or pulse measuring and impedance measuring over a frequency spectrum.

In galvanostatic turn-on measuring a defined current pulse is forced on the layer during the coating time at regular intervals. The voltage resulting as a function of time in each instance shows the different characteristic conduction processes in the layer.

Through electronic evaluation of the measuring signals and comparing the measuring signals with recordings of reference values characteristic of a particular layer state relative to its coating time, conclusions regarding the coating quality can be drawn.

The process is controlled by a process control computer using the recorded data.

In alternating current measuring over a given frequency spectrum, the different conduction processes in the material layer, for example, conduction through different locii, can each be represented by a different real versus imaginary component graph.

The layer is acted upon at regular time intervals by a given frequency spectrum. An electronic evaluation, for example Fast Fourier Transform analysis (FFT), is carried out. The prior recording of particular reference values over the coating time supplies values for comparisons which permit conclusions concerning coating quality.

The process can likewise be controlled by a process control computer using the data supplied by the FFT analysis.

The time required for measuring and evaluating the present state of the layer using either method is small compared to the coating time.

For practical applications, electric shielding of the impedance measuring cell is required.

Determination of the process temperature takes place according to the present invention through a thermoelectric element pair. The reference temperature for this can be determined in different ways.

The measuring method is suitable for on-line measurement of growing layers prepared by vapor deposition using either electron beam or indirect heating and sputtering using either magnetic field-supported high frequency or direct current cathode sputtering.

Further important applications for on-line measuring of growing layers include monitoring the chemical deposition of layers from the gas phase (chemical vapor deposition, CVD) and from the liquid electrolytic phase through deposition of metals, alloys, and dispersions.

Due to the distinctive layer structure caused by graining, sprayed layers are well suited for analysis by this measuring method. Spraying methods can include flame, light arc, plasma and detonation spraying.

When stripping layers with or without reactive gases, which gases can be activated in different ways, for example, in plasma, this measuring method can be used for characterizing the particular surface and layer states during the stripping process.

The same applies even if the stripping process only acts briefly on the coated/uncoated work piece or structural element, as occurs in plasma treatment of surfaces for further processing.

The various non-static measuring methods are in principle not limited by a minimum conductivity of the layer. Layers of low conductivity can be analyzed as well as a series of layers of different conductivity during their respective formation.

Going beyond the actual coating process, this measuring method can additionally or alternatively detect the selective treatment of or changes to the surface during plasma, implantation and ion beam treatment. For example, this method can characterize the conductivity changes and the doping profile connected to it of implanted semiconductor layers directly. The same is true for direct measurement of the capacitance of dielectric layers in foreign or original substrates and for direct measurement of the magnetic induction of magnetic layers.

Electrically insulating layers, for example $SiO_2$ (quartz), are of particular importance in the field of electronics. Increasingly they are also applied as functional layers in materials, where they serve as wear and tear protection, corrosion protection, oxidation protection, diffusion blocking or adhesion imparting layers.

The measuring method according to the invention is also suitable for measuring the layer properties of conducting layers given the appropriate sensor design.

Conduction processes taking place in a layer which has different time constants or conductivity (mobility) can be represented as separated in time through the application of non-static electrical measuring methods.

The different real and imaginary conduction processes and hence impedances characterize the layer state, which is given by its structure, texture, morphology, and thickness.

In galvanostatic turn-on or pulse measurements, in which the time delay (filter effect) is evaluated, the structure, morphology, and thickness changes of the growing layer are indicated through changes in the resultant voltage/time curves (measuring signal).

The electronic evaluation of the resulting measuring signals and the indication of characteristic values (impedance values) therefrom over the coating time permits drawing conclusions regarding the coating quality.

Impedance measurements on the growing layer using a frequency spectrum (locus curve) with different frequencies can take place simultaneously by using a noise signal or pseudo-noise signal or sequentially by using an oscillator with variable frequency.

Evaluation takes place by comparing the test and the measuring signal. Changes of structure, texture, morphology, and layer thickness discovered during impedance measurements are indicated through position changes in the locus curves in the real-imaginary diagram.

Electronic evaluation takes place here, for example, by way of a FFT analysis with a conversion into the characteristic values. The representation of characteristic values therefrom over the coating time allows conclusions regarding coating quality.

In both cases the thickness changes in the layer can readily be separated from a structural or morphological change. The measuring arrangement corresponds to the usual two or four point measuring method, with the placement of the electrodes under, in or on the layer, fixing the electrodes and determining the value of the existing resistances, capacitances and inductivities.

In order to be able to detect volume resistivity (intrinsic resistance) as a characteristic property in the case of a strong electric insulater layer material, the electrodes must be arranged or structured closely together.

If relatively low-ohm layer resistances are to be evaluated, it is advisable to apply or structure the electrodes at a greater distance from each other.

Further, the arrangement of the electrodes depends on the layer effect to be characterized; characterizing the nucleus formation and the growing together of the nuclei requires that planar electrodes be lithographed onto the substrate.

Changing from one electrode arrangement to another electrode arrangement during the formation of the layer for characterization of different layer effects is likewise possible.

If a layer is present, which layer's capacitive component must be increased in order to permit relying on it as the characteristic property for the layer formation, the electrodes must be arranged over a large area.

In practice it is useful to proceed so that during the preparation of a layer which achieves the desired properties under defined process conditions, reference measurements are carried out, evaluated, and stored. The stored data, which is derived during the production of this model layer, are used for process control during subsequent manufacturing operations.

It is possible to transmit the measured values, which serve as the basis for evaluating the layer properties, in various ways, for example, telemetrically.

In other embodiments of this invention, the following aditional features may be provided:

Transmission of the measured data can take place across conducting connections coupled to an evaluation instrument.

Independent mounting of the measuring system on the substrate holder can be accomplished, making it easily movable.

Transmission of the measured data takes place with a telemetry system to an evaluation instrument. The data is transmitted using the so-called PCM process. The transmission of the telemetry data takes place at high frequency. Transmitting the telemetry data can also take place using infra-red signals. However, the telemetry data can also be transmitted through inductive or capacitive coupling.

Attaching the antenna for the particular transmission method occurs in an insulated vacuum lead-through within a vacuum chamber.

Attaching the antenna takes place for the particular transmission method outside the vacuum chamber with utilization of appropriate non-shielded openings of the chamber, for example glass windows.

Still further embodiments of the measuring sensors for the different processes include:

The measuring sensor is formed from either a foreign substrate, for example, a non-conducting platelet, or the original substrate material, for example, the particular semiconductor material, and is provided with either attached or lithographed contacts for accepting the expected quantity to be measured.

In analyzing stripping processes, the measuring sensor is provided with a reference layer, which corresponds to the layer to be stripped.

For treating or changing the surface through plasma, implantation, and ion beam treatment, the sensors are made from the reference substrate, which corresponds to the material to be treated.

The measuring sensor is covered with a reference aperture, which permits achieving either a partial coating or stripping of the sensor. The cover has no conducting connection to the sensor.

In order to prevent disturbances from the plasma on the measurable variable during dynamic processes, in which the substrate holder is only briefly affected by the plasma, measurement takes place, if necessary, outside the direct plasma effect.

The transmitter is integrated with the measuring sensor and the current supply in a miniature construction which forms an independent measuring system.

Heat-insulated mounting of the miniaturized measuring system on the movable substrate holder takes place.

Construction of the measuring system takes place with materials that cause no vacuum contamination.

Construction of the measuring system can alternatively take place in a fashion that permits the vacuum-tight encapsulation of the structural elements.

The evaluating and transmitting electronics of the measuring system can be spatially separated from the measuring sensors.

The connection of the measuring system with the measuring sensors takes place through firm conducting connections.

The connection of the measuring system with the measuring sensors takes place through detachable connections, for example, spring contacts.

The frequencies occurring during HF sputtering are filtered out from the signals of the measuring sensors.

The excitation signals for the different measuring processes are generated autonomously in the movable measuring system.

The excitation signals for the different measuring processes can be controlled by the receiver component.

Various embodiments for evaluating the test and measuring signals from the measuring sensors include:

The measuring system accepts regular scanning signals of the variables required for evaluation and, until transmission, places the signals in intermediate storage. Through using analog prefiltering before scanning, clipping of the frequency band prevents alias errors from occuring during subsequent signal processing.

The scanned values are subsequently transmitted to an evaluation instrument.

The actual signal processing in the evaluation instrument is performed by either a digital filter algorithm or a FFT analysis.

After the signal processing in the evaluation instrument, the data calculated for determining the layer properties is supplied to a process control computer and this process control computer may be part of the evaluation instrument itself.

According to further developments, rapid intermediate storage of a large quantity of the scanning pair values comprising the test and measuring signals in the measuring system occurs. This is necessary for representing turn-on pulses.

An advantage may be seen in that in the measuring system the signals are accepted at a very high repetition rate. Since this is also the scanning frequency, a large band width, in particular, in pulse measurements, is covered.

Transmission to the evaluation instrument and the signal processing with respect to the scanning rate no longer occur in real time. Knowledge of the original scanning rate in the measuring system suffices for reproduction of the measured quantity.

Evaluation may require up to one second. This is still sufficiently fast to permit on-line regulation of the coating process.

In another embodiment the signal processing of the scanned measured variable is carried out in the movable measuring system.

Through the previously mentioned transmission processes the data is supplied to an evaluation instrument, which is required for analyzing the layer properties.

The analyzed data is supplied to a process computer, which can be part of the evaluation instrument.

Determination of the process temperature takes place with a thermoelectric element pair. The reference temperature for this purpose is determined in a relatively isothermal area inside or outside the vacuum chamber.

The temperature stabilization system, which can be built as part of or independent of the measuring system, operates electronically.

For brief coating processes the side of the measuring system facing away from the process is used as a thermal reference point, under the principle of thermal inertia.

The thermal reference point can also be formed by a force-cooled area of the substrate holder.

Providing a freely movable measuring system with supply voltage takes place either by way of spring contacts, which can be arranged on the substrate carrier, by way of solar cells, which are excited either by the plasma glow or by additional light sources, or through a HF carrier, which is provided either by the HF spectrum of the coating process or from an additional HF coil.

Voltage supply can also be batteries or rechargeable accumulators.

The results of the measuring process can be displayed while the process is still running (on-line) on a display medium, for example a CRT.

Calculating the difference between the on-line results and the stored reference curves as well as indications of the differences between them can also take place on the display medium.

Coupling the measuring process to a process control computer takes place—for the purpose of process checking or process control or regulation—by comparing the on-line results of the measuring process with stored reference curves, perhaps derived from an earlier process run, and calculating the control or regulating values for the process in aknown manner.

BRIEF DESCRIPTION OF THE DRAWINGS

The foregoing and other objects and advantages of the present invention will become more readily apparent from the following detailed descriptions, as taken in conjunction with the accompanying drawings, wherein.

DETAILED DESCRIPTION

Figure 1A:
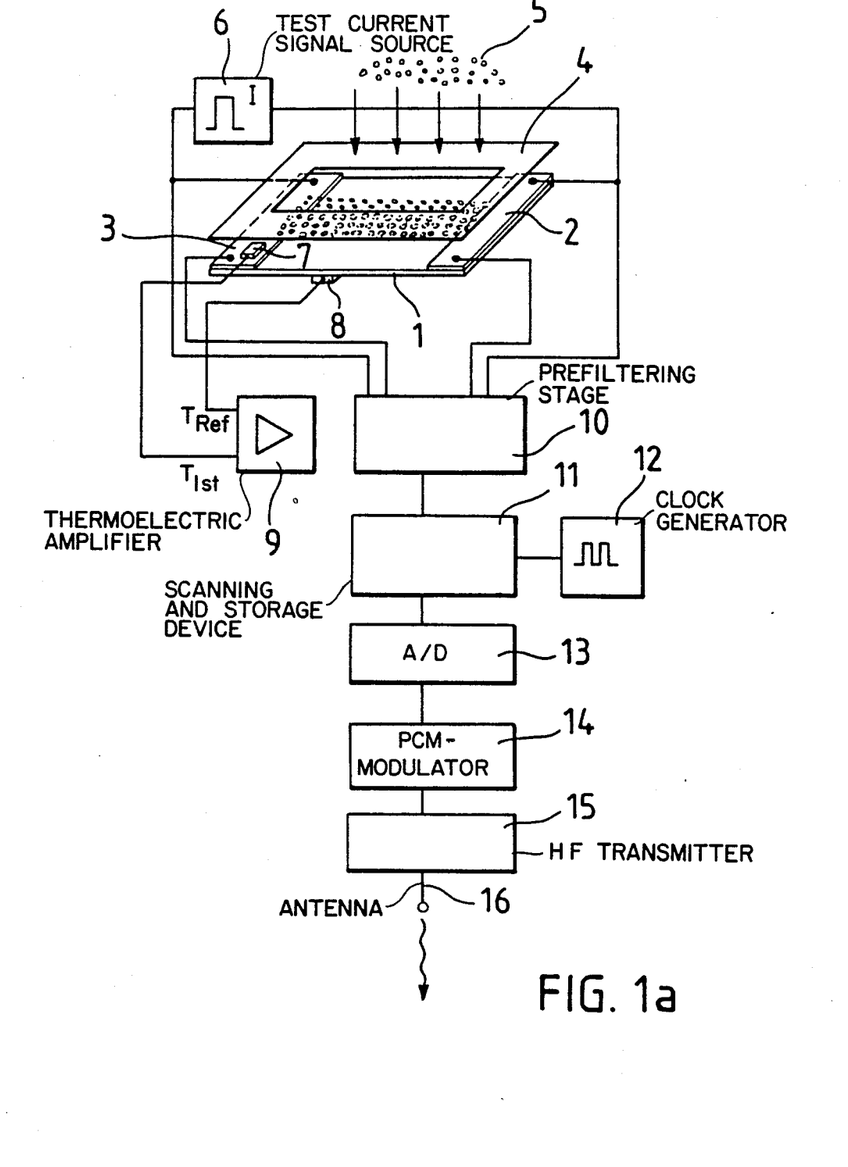
FIG. 1a and 1b are schematic representations of the device for determing material layer characteristic values.

Referring to FIG. 1a, a material layer carrier 1 is shown, its lateral ends having contact regions 2 and 3. Material layer carrier 1 is a component of a model coating device. Above the material layer carrier is mask 4. During vapor deposition using sputtering or chemical deposition, layers are generated on the material layer carrier 1 with characteristic structure, texture, and morphology. These layers are formed from particles represented as material particles 5. A test current signal source 6 is connected to contact areas 2 and 3. Temperature sensors 7 and 8 measure an actual temperature and a reference temperature respectively and supply them to thermoelectric amplifier 9.

Pre-filtering stage 10 is coupled to amplifier 9 and filters out interfering frequency components. Scanning and storage device 11 is coupled to pre-filter 10 and is clocked by clock generator 12. An analog to digital converter 13 is coupled to scanning and storage device 11, the output of which is coupled to a PCM modulator 14. The PCM modulator 14 is coupled to HF transmitter 15, the output signals of which are transmitted by an antenna 16.

Figure 1B:
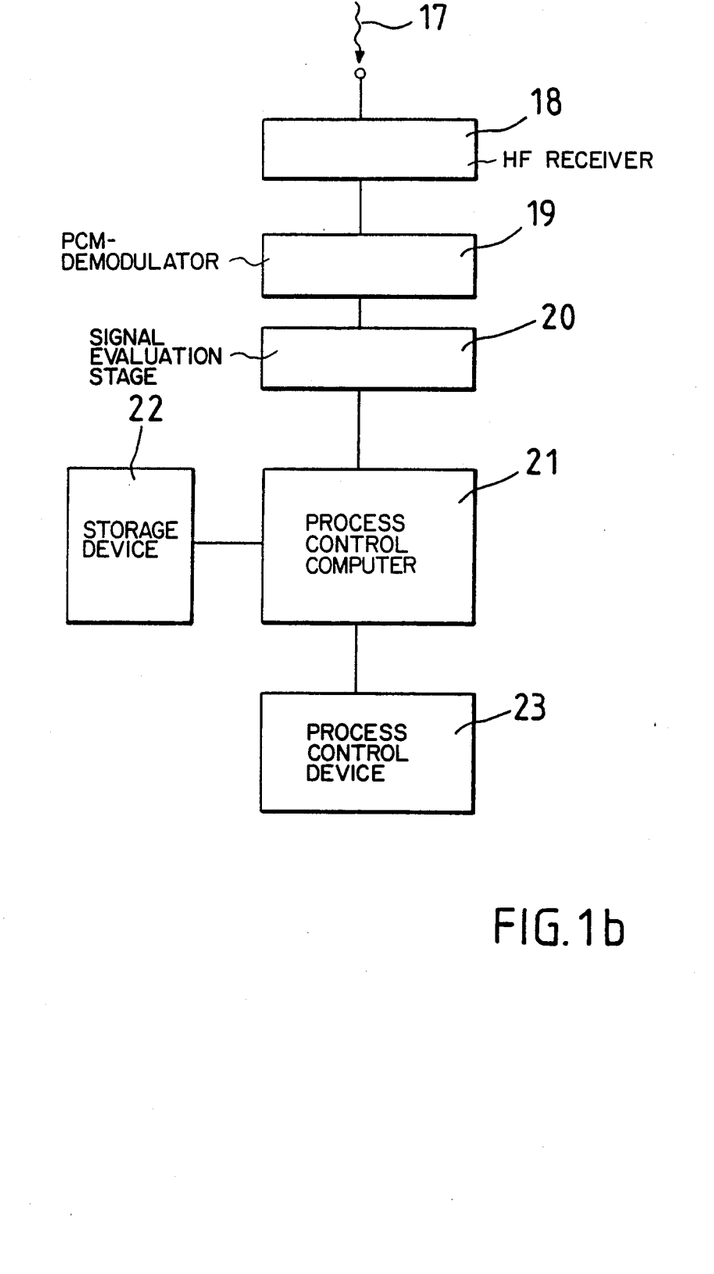

Referring now to FIG. 1b, the modulated measuring signals 17 are received by a HF receiver 18 and supplied to PCM demodulator 19. Signal evaluation takes place in a signal evaluation stage 20. The output signals of this signal evaluation stage 20 are supplied to process control computer 21. The process control computer 21 compares the continuously measured and processed actual value data with reference values which are stored in storage device 22. The process control computer 21 uses the results of this comparison to generate control data for controlling coating in process control device 23. Through process control device 23, for example, a parameter of the layer material can be affected by either changing the substrate temperature, the gas pressure, the ionization of the plasma, the deposition rate or the substrate bias voltage during sputtering, etc.

These control possibilities are only mentioned as examples.

Figure 7:
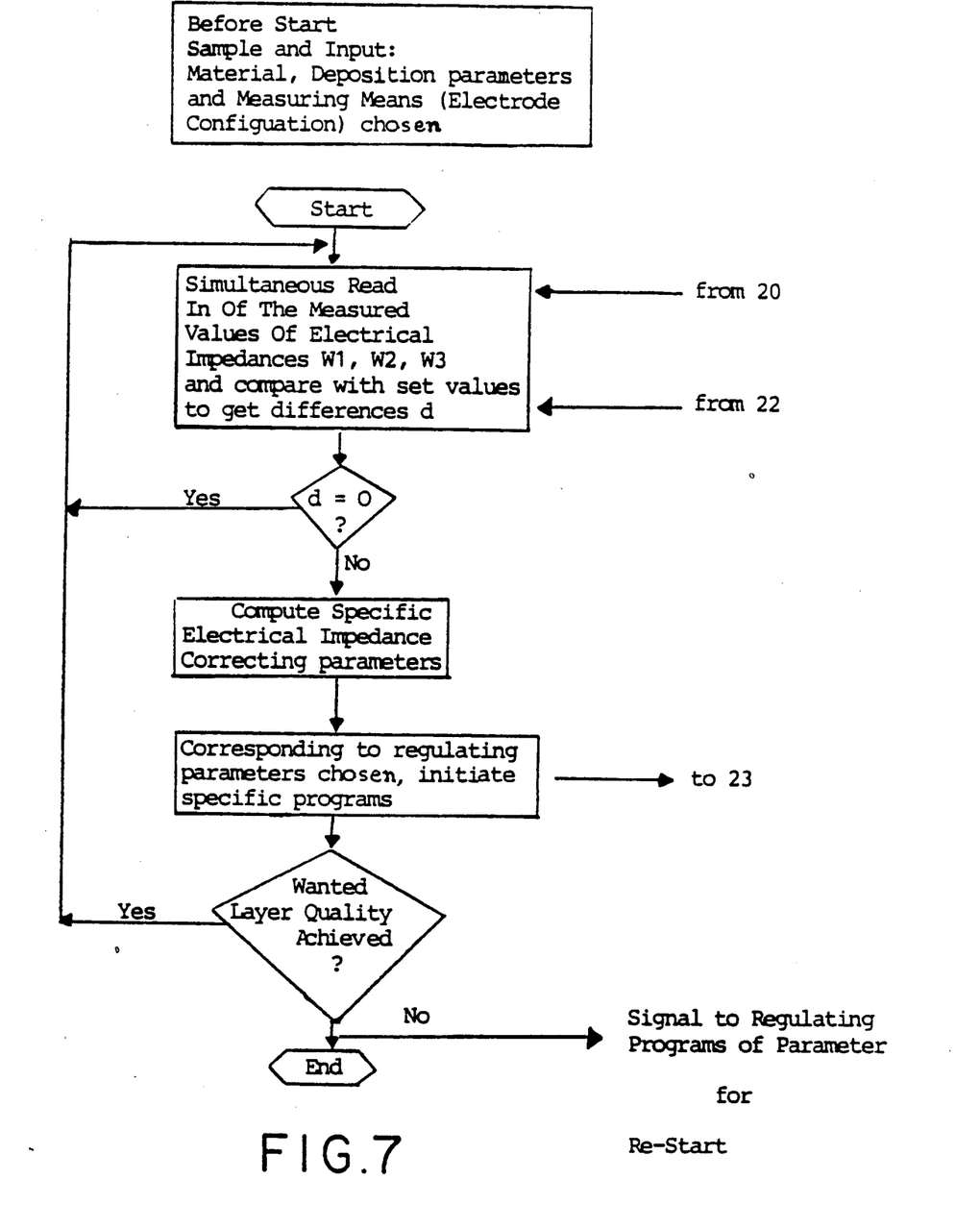
FIG. 7 is an example of a flowchart of the process according to the present invention.

FIG. 7 is a flowchart of the process shown in FIG. 1b.

Figure 2:
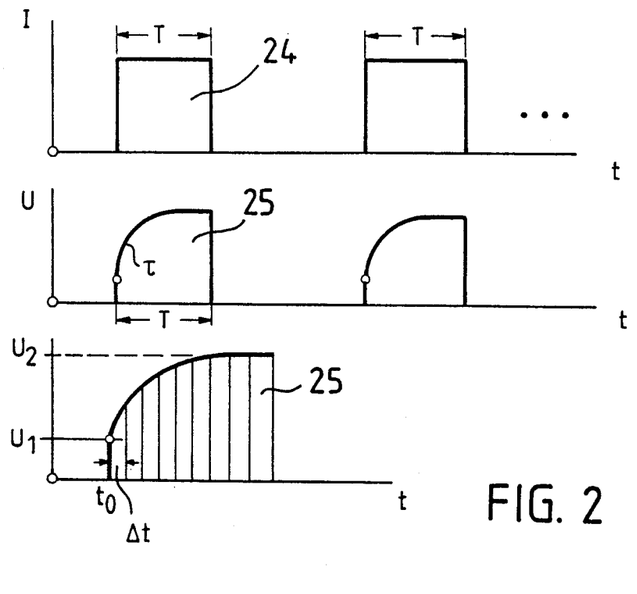
FIG. 2 shows the test and measuring signals which typically occurs in galvanostatic turn-on measurement.

Referring now to FIG. 2, the applied test signal is a current pulse 24. These test current pulses 24 are applied to the material layer. The layer's response to the test signal is called the measuring signal 25, which is a voltage signal. Signal 25 shows a given voltage response over time corresponding to the response of the material. During time T of the test and measuring signals, different time constants can occur which are characteristic of, for example, capacitance changes, inductivity changes and/or conductivity changes in the material layer. Further characteristics are the initial voltage value $U_1$ and the final voltage value $U_2$. Scanning of the measuring signal 25 takes place at small time intervals t.

Figure 3:
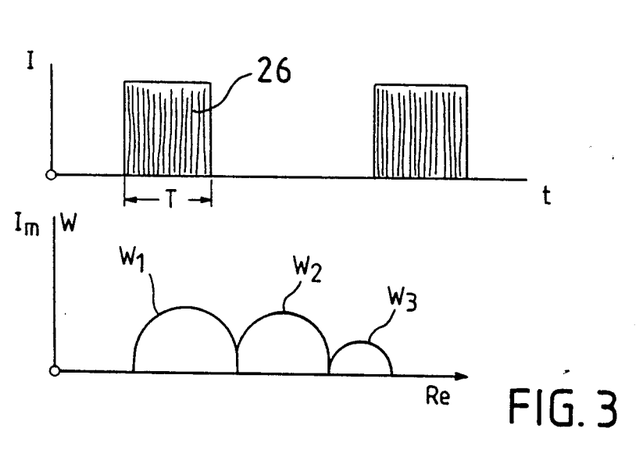
FIG. 3 shows the test signal and the calculated locus curves in an alternating current measurement system using frequency spectrum.

According to FIG. 3, a noise signal 26 is used as a test signal and is repeatedly applied during time t for periods of T time. As a result, following evaluation in signal evaluation stage 20, an impedance locus curve W(f) is obtained, indicated as example by three semicircles. The locus curve shows the impedance values with their real and imaginary components.

The total impedance locus curve is divided into 3 locus curve ranges $W_1$, $W_2$, and $W_3$. Each of these locus curve ranges is characteristic of a given conduction process in the layer being investigated. These locus curve ranges $W_1$ to $W_3$ are separable from each other in time and therefore are conclusive of the different impedance components called intrinsic impedance, grain boundary impedance, and surface impedance.

Figure 4A:
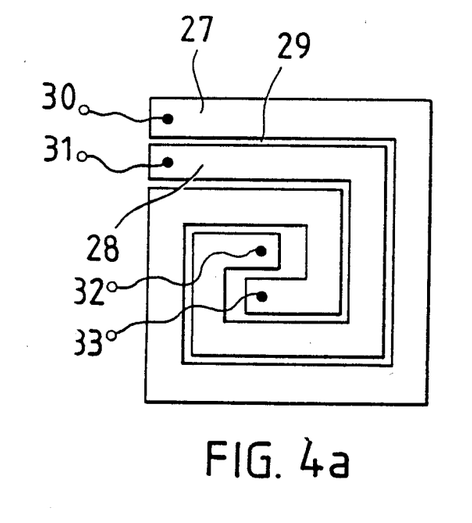
FIG. 4a, 5a and 5b represent material layer measuring electrode configurations.
Figure 4B:
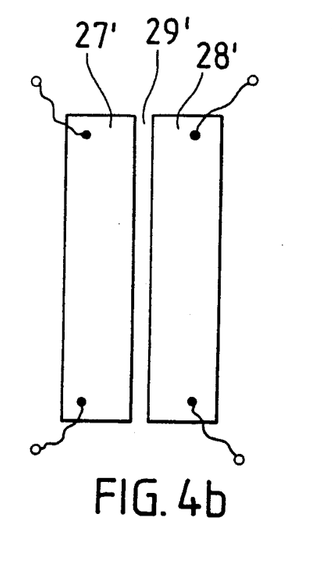

FIG. 4a shows two measuring electrodes 27 and 28 formed in a snail-like configuration in order to fix a correspondingly configured material layer region 29. Contact connections are labeled 30, 31, 32, and 33. This narrow and particularly long form of the material layer electrode has the advantage of a corresponding decrease in the impedance resistance, in particular a decrease in its real component. Particularly with poorly conducting materials, this decrease is advantageous in order to shift the locus curve. In FIG. 4b a material layer 29' of correspondingly shorter length and greater width is shown between measuring electrodes 27' and 28'.

Figure 5A:
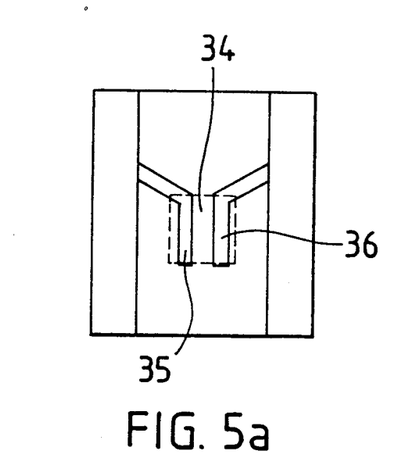
Figure 5B:
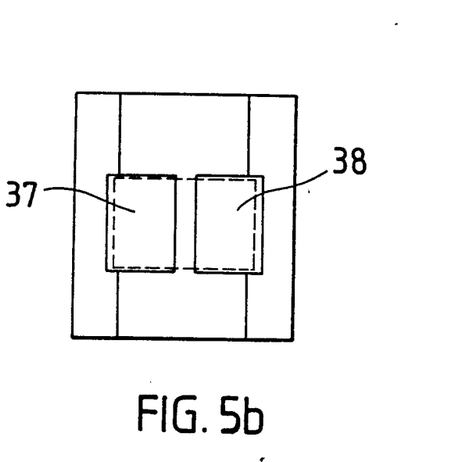

In FIGS. 5a and 5b material layer and measuring electrodes are shown which work well with capacitive materials.

In FIG. 5a the effective material layer is denoted 34. It is located between two measuring electrodes 35 and 36. In FIG. 5b the contact areas are larger and referred to as 37 and 38.

Figure 6A:
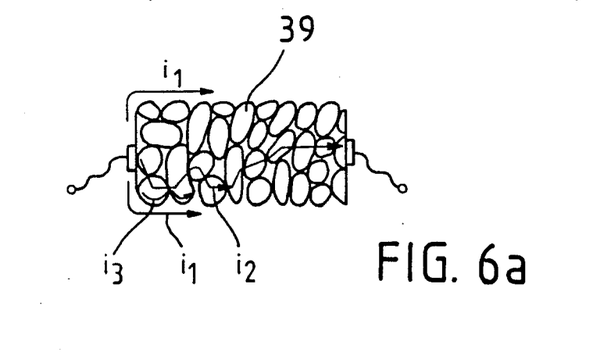
FIG. 6a, 6b and 6c show schematic particle configurations of a material layer.

FIG. 6a shows a greatly enlarged section of a material layer with differently configured particles 39. $i_1$ refers to the surface current, $i_2$ to the intrinsic current which flows through the particles, and $i_3$ the particle current which flows over the surface boundary of the discrete particles.

Figure 6B:
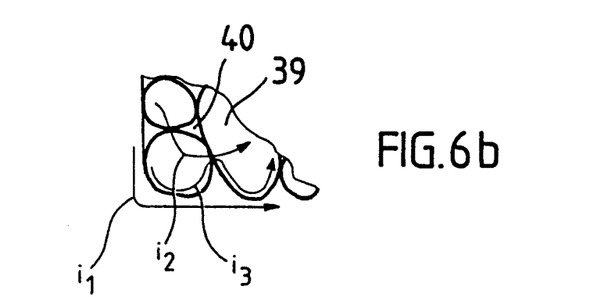

FIG. 6b shows a section of FIG. 6a, further enlarged. The discrete particles have contact areas different from each other and different transition resistances at the contact sites. These are a function of the material. Between a part of the particles are tiny hollow spaces 40, which have a capacitive character. The individual current components $i_1$, $i_2$, and $i_3$ flow at different rates and, therefore, have different time constants, depending on the particular material.

Figure 6C:
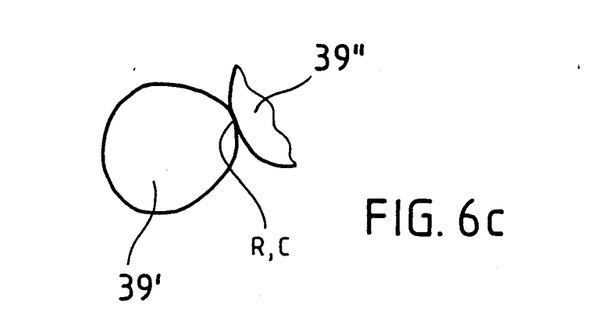

FIG. 6c shows two particles 39' and 39" meeting each other. R and C refers to the contact resistance and the capacitance between these two particles.

During the layer formation, after repeated measurements, locus curve shift still occur, which give information about the changes of the material properties.

Although the invention has been described with respect to preferred embodiments, it will be appreciated that various rearrangements and alterations of parts may be made without departing from the spirit and scope of the present invention, as defined in the appended claims.

What is claimed is:

1. In a production process for either the reproducable formation of material layers on substrates by vapor deposition, sputtering, chemical deposition or similar methods or the treatment of material layers on substrates, the method for controlling the process comprising the repeatable steps of
   generating a test signal;
   applying the test signal to the layers whose growth and characteristic parameters will be used to control the process;
   receiving the test signal from the layer;
   analyzing the test signal by determining its impedance components, said impedance components comprising intrinsic impedance, grain boundary impedance and surface impedance;
   comparing the test signal's impedance components with stored reference impedance component values for the layer being tested; and
   controlling the parameters of the process in response to the differences detected between the stored reference impedance component values and the test signal's impedance components.

2. The method of claim 1, wherein the test signal may be one of a preset shape, preset frequency spectrum and preset frequency sequence.

3. The method of claim 1, wherein the process being controlled is the manufacturing of semiconductor elements.

4. The method of claim 1, wherein the impedance components are comprised of intrinsic current components, characteristic of the current flowing through homogeneous regions of the layer, grain boundary current components, characteristic of current flowing over the particle boundary areas, and a surface current component, characteristic of the current flowing over the layer's surface.

5. The method of claim 4, wherein a digital process control computer performs the analyzing, comparing and varying steps.

6. The method of claim 4, further characterized in that the test signal is a galvanostatic pulse with predefined shape and is applied to the layer as a current pulse.

7. The method of claim 4, wherein the repetition rate of the test signal is determined by the rate of the layer's formation.

8. The method of claim 4, wherein the values of the impedance components of the layer being tested are compared with reference impedance component values and, upon deviation from the reference values, the process is altered accordingly.

9. The method of claim 4, wherein applying the test signal is performed by electrodes adapted to the magnitude of the impedance values of the layer to be examined.

10. The method of claim 4, wherein applying, receiving and analyzing the test signal occurs outside the process chamber to avoid the disturbing effect of the plasma during the process.

11. The method of claim 4, further comprising simultaneously placing a reference substrate, which corresponds to the material being treated, in the process chamber and observing the effects on the reference substrate when a process which will change the layers being studied through plasma, implantation, and/or ion beam radiation treatment will occur.

12. The method of claim 4, wherein the test signal is received and analyzed at preset intervals.

13. The method of claim 12, wherein the test signal values are digitized and compared to the stored reference impedance values for determination of the layer's growth and characteristic parameters.

14. The method of claim 12, further characterized in that the test signal, a signal with preset frequency range, preferentially a noise signal or a signal sequence with increasing or decreasing frequency, is applied to the layer and that analyzing the test signal comprises evaluating the digitized test signal and calculating a plurality of impedance values to form an impedance locus curve, which locus curve form is further divided into locus curve sections for signal components of approximately identical time constants and that these locus curve sections permit the determination of the layer's characteristic values.

15. The method of claim 14, wherein analyzing of the test signals occurs by means of Fast Fourier Transform Analysis.

16. The method of claim 15, wherein the calculated impedance locus curve values are stored and compared with the reference impedance locus curve values by application of a correlation algorithm.

17. In a production process for either the reproducable formation of materal layers on substrates by vapor deposition, sputtering, chemical deposition or similar processes or the treatment of material layers on substrates, wherein the substrates are held by a holder, an apparatus for controlling the process comprised of:
   signal generation means for generating a test signal to be applied to a layer whose growth and characteristic parameters will be used to control the process;
   signal application means coupled to the signal generation means for applying the test signal to the layer;
   signal receiving means for receiving at test signal from the layer;
   signal processing means coupled to the receiving means for processing the test signal into impedance component values, said impedance component values comprising intrinsic impedance, grain boundary impedance and surface impedance;
   comparison means coupled to the signal processing means for comparing the impedance component values from the processing means with reference impedance component values; and
   control means coupled to the comparison means for altering the process, depending upon the results from the comparison means.

18. The apparatus of claim 17, wherein the signal generation, application and receiving means are combined, independently mounted on the layer being studied and are freely movable.

19. The apparatus of claim 17, wherein the signal receiving means is a measuring sensor and the signal generation means and the signal processing means are coupled to the measuring sensor which sensor is spatially separated from the signal generation means and the signal processing means and the connection of the measuring sensor to the signal generation means and signal processing means can be either permanent or detachable.

20. The apparatus of claim 17, wherein the test signals are digitized in the signal processing means and transmitted to the comparison means at a rate which permits the synchronous transmission and evaluation of the test signal.

21. The apparatus method of claim 17, wherein the comparison means and the control means are a process control computer capable of process monitoring, process control, and process regulation.

22. The apparatus of claim 17 wherein the signal application means and signal receiving means are measuring sensors, said sensors having a reference aperture which permits partial deposition on or stripping of the sensor.

23. The apparatus of claim 17, wherein the signal receiving means filters out unwanted frequencies occurring during H.F. sputtering.

24. The apparatus of claim 17, wherein the test signals are digitized and stored in the signal processing means until transmission to the comparison means can occur at slow speed.

25. The apparatus of claim 24, wherein the signal processing means and the comparison means are combined and the combined means transmits to the control means only the results of the comparison.

26. The apparatus of claim 17, wherein the comparison means displays the results of the comparison on a visual display means.

27. The apparatus of claim 26, wherein the comparison means displays the reference impedance component values, the current impedance component values and the results of the comparison simultaneously on the visual display means.

28. The apparatus of claim 17, wherein the signal receiving means transmits the test signal by means of a telemetry means to the processing, comparison and control means.

29. The apparatus of claim 28, wherein the telemetry means transmits the measuring signal by use of the P.C.M. method.

30. The apparatus of claim 28, wherein the telemetry means transmits the test signal by means of one of high frequency radio signals, infrared signals, inductive coupling signals and capacitive coupling signals.

31. The apparatus of claimm 28, wherein an antenna is coupled to the signal receiving means with an insulated vacuum lead-through for use within a vacuum chamber.

32. The apparatus of claim 17, wherein the signal application means and signal receiving means comprise measuring sensors in the form of non-conducting platelets, for example, glass, with attached or lithographed contacts for accepting the test signals.

33. The apparatus of claim 32, wherein the measuring sensors are coated with a reference layer prior to a stripping process so that the depth of stripping may be accurately measured.

34. The apparatus of claim 32, wherein the measuring sensors are adapted to the layer effect being examined.

35. The apparatus of claim 32, wherein a plurality of measuring sensors are used to measure a plurality of layer processes and effects.

36. The apparatus of claim 17, wherein a thermoelectric element pair determines the operating temperature of the process.

37. The apparatus of claim 36, wherein one element of the thermoelectric element pair used in brief deposition processes is located on the side of the processing apparatus facing away from the process so that thermal inertia allows this element to act as a thermal reference point.

38. The apparatus of claim 36, wherein one element of the thermoelectric element pair is located on a force-cooled site of the substrate holder and serves as a thermal reference point.

39. The apparatus of claim 36, wherein one element of the thermoelectric pair is located in a relatively isothermal area within or outside the vacuum chamber where the process takes place and the isolated element acts as a thermal reference point.

40. The apparatus of claim 39, wherein the thermoelectric pair controls a temperature stabilization system.

41. The apparatus of claim 17, wherein the signal application means, signal generation means, and signal processing means are constructed together, coupled with a voltage supply means, and form an independent measuring system.

42. The apparatus of claim 41, wherein the miniaturized circuit is mounted on a insulating mounting and placed on a movable substrate holder.

43. The apparatus of claim 41, where the miniaturized circuit is comprised of materials which are nonreactive and nonvolatile in a vacuum.

44. The apparatus of claim 41, where the miniaturized circuits's elements are encapsulated in a vacuumtight structure.

45. The apparatus of claim 41, wherein the signal generation means generates excitation signals for different measuring processes autonomously in the miniaturized circuit.

46. The apparatus of claim 41, wherein the means to apply a voltage supply to the freely movable means comprises spring contacts, which are attached to the substrate carrier.

47. The apparatus of claim 41, wherein the voltage supply means is a solar cell, which is driven from a plasma glow or an additional light sources.

48. The apparatus of claim 41, wherein the voltage supply means comprises a H.F. energy receiver, which receives H.F. energy from the H.F. spectrum of the coating process or from an additional H.F. coil energy source.

49. The apparatus of claim 41, wherein the voltage supply means is a primary battery or a rechargable accumulator.

* * * * *